United States Patent
Jost et al.

(10) Patent No.: US 10,048,296 B2
(45) Date of Patent: Aug. 14, 2018

(54) DETECTION OF CURRENT CHANGE IN AN INTEGRATED CIRCUIT

(71) Applicant: Infineon Technologies AG, Neubiberg (DE)

(72) Inventors: Franz Jost, Stuttgart (DE); Jens Barrenscheen, Munich (DE); Philip Georg Brockerhoff, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 830 days.

(21) Appl. No.: 13/862,439

(22) Filed: Apr. 14, 2013

(65) Prior Publication Data

US 2014/0306551 A1 Oct. 16, 2014

(51) Int. Cl.
| | | |
|---|---|---|
| G01R 31/02 | (2006.01) | |
| G01R 31/26 | (2014.01) | |
| G01R 19/00 | (2006.01) | |
| G01R 31/28 | (2006.01) | |
| G01R 31/00 | (2006.01) | |
| G01R 31/317 | (2006.01) | |
| H01L 23/00 | (2006.01) | |
| G01R 15/18 | (2006.01) | |

(52) U.S. Cl.
CPC ........... *G01R 19/00* (2013.01); *G01R 15/181* (2013.01); *G01R 31/002* (2013.01); *G01R 31/26* (2013.01); *G01R 31/2642* (2013.01); *G01R 31/2648* (2013.01); *G01R 31/2831* (2013.01); *G01R 31/31702* (2013.01); *H01L 24/34* (2013.01); *H01L 2924/00014* (2013.01); *H01L 2924/13055* (2013.01); *H01L 2924/13091* (2013.01); *Y10T 307/865* (2015.04)

(58) Field of Classification Search
CPC .. G01R 31/26; G01R 31/2642; G01R 31/2648; G01R 31/2831; G01R 31/31702; G01R 31/002; G01R 31/00; G01R 31/327; G01R 31/333; H01H 1/0015
USPC ..... 324/71, 378, 403, 415, 500, 537, 762.01
See application file for complete search history.

(56) References Cited

U.S. PATENT DOCUMENTS

| | | | | |
|---|---|---|---|---|
| 5,963,038 A | * | 10/1999 | De Jong | G01R 31/3173 324/127 |
| 6,011,397 A | * | 1/2000 | Yasuda | F02P 17/12 324/388 |
| 2007/0024288 A1 | * | 2/2007 | Hu | H02M 3/33507 324/547 |
| 2007/0076447 A1 | * | 4/2007 | Berghegger | H02M 3/3385 363/19 |
| 2007/0182421 A1 | * | 8/2007 | Janke | G06F 21/558 324/522 |

(Continued)

FOREIGN PATENT DOCUMENTS

| | | |
|---|---|---|
| CN | 101379405 A | 3/2009 |
| JP | H07131316 A | 5/1995 |

OTHER PUBLICATIONS

T. Reiter, et al.: "PWM Dead Time Optimization Method for Automotive Multiphase DC/DC-Converters", IEEE Transactions on Power Electronics, vol. 25, No. 6, Jun. 2010.

*Primary Examiner* — Huy Q Phan
*Assistant Examiner* — Raul Rios Russo
(74) *Attorney, Agent, or Firm* — Slater Matsil, LLP

(57) ABSTRACT

An embodiment relates to an integrated circuit comprising measurement means for detection of a current change, wherein said measurement means comprise at least one coil.

45 Claims, 5 Drawing Sheets

(56) References Cited

U.S. PATENT DOCUMENTS

| | | | | |
|---|---|---|---|---|
| 2008/0012041 | A1* | 1/2008 | Kesler | F02P 3/053 |
| | | | | 257/139 |
| 2008/0024095 | A1 | 1/2008 | Lampinen | H02M 3/33507 |
| | | | | 323/247 |
| 2009/0135531 | A1* | 5/2009 | Hirata | H02H 3/093 |
| | | | | 361/18 |
| 2009/0316441 | A1* | 12/2009 | Hu | H02M 3/33592 |
| | | | | 363/21.06 |
| 2010/0110593 | A1* | 5/2010 | Kim | H02M 1/32 |
| | | | | 361/18 |
| 2011/0019322 | A1* | 1/2011 | Akama | H02M 1/32 |
| | | | | 361/93.1 |
| 2012/0014227 | A1* | 1/2012 | Honmura | G04C 3/143 |
| | | | | 368/80 |
| 2013/0140890 | A1* | 6/2013 | Nisonen | H02H 9/025 |
| | | | | 307/24 |
| 2014/0376273 | A1* | 12/2014 | Hosotani | H02M 1/32 |
| | | | | 363/21.02 |

* cited by examiner

DETECTION OF CURRENT CHANGE IN AN INTEGRATED CIRCUIT

BACKGROUND OF THE INVENTION

Embodiments of the present invention relate to electronic applications, in particular integrated circuits. Such applications can be used in the area of power electronic, wherein a current needs to be measured in order to control a particular parameter, e.g., a rotational speed of a power train, a torque or an output voltage of an AC converter or the like.

SUMMARY

A first embodiment relates to an integrated circuit comprising measurement means for detection of a current change, wherein said measurement means comprise at least one coil.

The integrated circuit refers to a semiconductor device optionally comprising passive components bonded to a substrate or circuit board. The integrated circuit may also refer to a chip or piece of silicon, e.g., die, that is connected to pins of, e.g., a chip housing.

The coil may in particular comprise one winding or more windings; the coil is preferably open so that a voltage can be determined at the end of the coil; such voltage may be based on electromagnetic induction. The current flowing through a portion of the integrated circuit in the vicinity of the coil changes the magnetic field; this change can be detected by said coil, which provides a voltage based on change of the current.

A second embodiment relates to a device for measuring a current change in an integrated circuit, wherein the device is arranged for determining the current change via a voltage that is induced in at least one coil located on or in the integrated circuit.

A third embodiment relates to a method for measuring a current change in an integrated circuit, wherein the current change is determined via a voltage that is induced in at least one coil located on or in the integrated circuit.

A forth embodiment is directed to a device for measuring a current change in an integrated circuit comprising a comparing means for comparing a signal from at least one coil that is arranged on or in an integrated circuit with a reference signal, and comprising a processing logic that is connected to the output of the comparing means, wherein the processing logic provides an output signal dependent on a voltage induced in the at least one coil.

A fifth embodiment relates to a system for measuring a current change in an integrated circuit comprising means for determining the current change via a voltage that is induced in at least one coil, wherein the at least one coil is located on or in the integrated circuit.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

In electronic applications, in particular in the area of power electronic, current is measured in order to control a desired factor of a circuit, e.g., a rotational speed of a power train, a torque, an output voltage of an AC converter or the like. The current sensor typically has a limited measuring range. Due to this limitation (e.g. to 150% or 200% of the nominal operating range), a standard sensor may not be suitable to detect the actual value of the overcurrent. Especially for overcurrent events with a high variation of the current (high value of di/dt) over a certain time and short circuits with 5 to 10 times the nominal current, the switch must not be opened if an overcurrent is detected (otherwise the switch would be destroyed). In this case, a fuse can be used to stop the current or the switch can be opened when a predetermined current limit is reached or exceeded. Contrary to this type of overcurrent events, for lower values of overcurrent, the switch can be opened to limit the current. Outside the overcurrent phase the switch may be switched off. This may be below a first threshold, e.g., three times the nominal current, and above a second threshold, e.g., five times the nominal current.

Other measures can be taken to switch off the switch during an overcurrent phase. For example, a driver may switch with a reduced gate voltage or a higher gate resistor can be used to limit voltage transients that may damage the device. It is also an option to switch off the switch with various levels, e.g., at various (e.g., more than one) gate voltages.

If the standard current sensor is limited to a measurement range lower than the high-value overcurrent range, an alternative detection method can be used that works independently from the actual level of the current. Depending on the level of the overcurrent, a different reaction is required to prevent damage of the switch in particular because the switch may be more expensive than a fuse.

In case the measuring range is left because of a transient event, a circuit is required that determines the current outside this measuring range. Such transient event may be based on slipping or blocking wheels of a power train, an electrical surge due to lightning or the like.

MOSFETs or IGBTs are examples of power switches. In case of an IGBT, switching off the current is only allowed when the device operates in a predefined current range.

Figure 1:
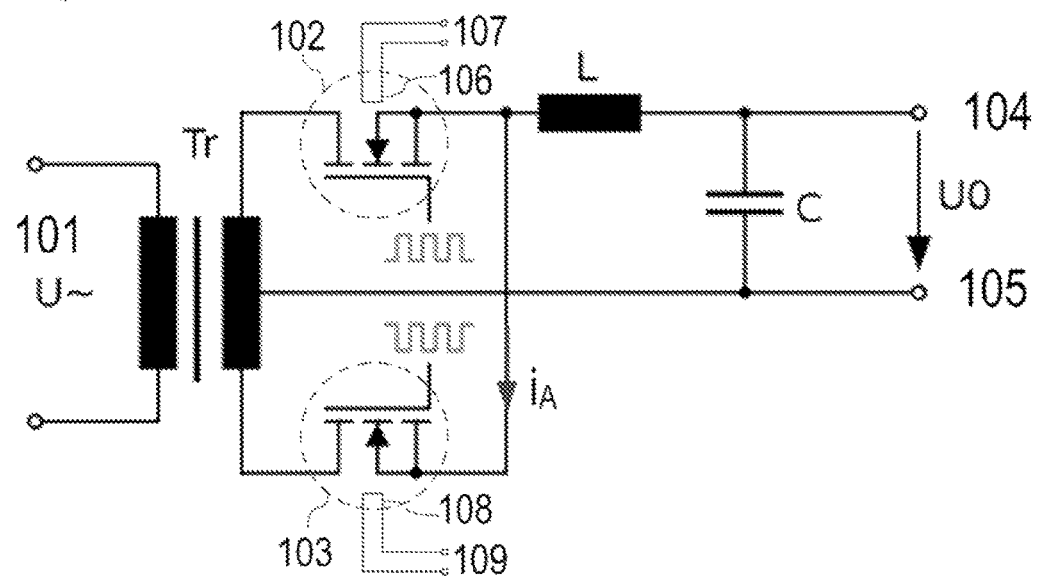
FIG. 1 shows an exemplary circuit diagram of an active rectifier as used in power supplies.

FIG. 1 shows an exemplary circuit diagram of an active rectifier as used in power supplies.

An AC voltage 101 is fed to the primary side of a transformer Tr. The secondary side of the transformer Tr is connected via two MOSFETs 102 and 103 and via an inductor L to a positive pole 104 of a rectified signal U0. In addition, the secondary side of the transformer Tr supplies a tap that provides a negative pole 105 of the rectified signal U0. In addition, a capacitor C is connected across the output, i.e. the pole 104 and the pole 105.

Each of the MOSFETs 102 and 103 comprises a body-diode. For optimizing the loss caused by the body-diode the MOSFET switch can be activated while the body-diode is conducting. In order to switch off the MOSFET in time before the zero-crossing of the current needs to be determined. The solution presented allows determining a change of the current (di/dt) and thereby enables controlling the electronic switches (here the MOSFETs 102 and 103) in a loss-optimized manner.

The MOSFET 102 comprises a coil 106 that can be connected via two connections 107 to detect or process a voltage induced in the coil 106. Accordingly, the MOSFET 103 comprises a coil 108 that can be connected via two connections 109 to detect or process a voltage induced in the coil 108.

Figure 6:
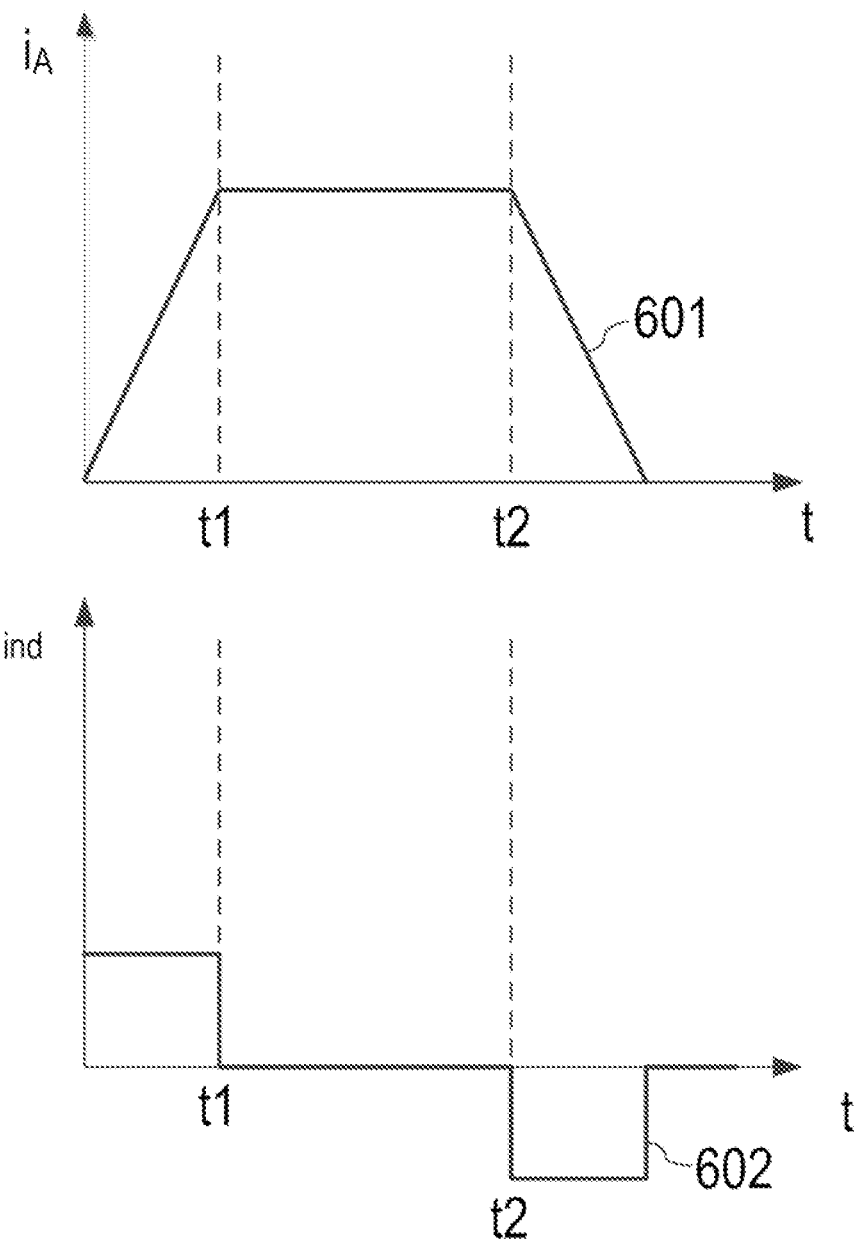
FIG. 6 shows a diagram of a current in view of an induced voltage over a time t.

A current $i_A$ flows from the inductor L towards the source of the MOSFET 103. FIG. 6 shows a diagram of a signal 601 of the current $i_A$ as well as a diagram of a signal 602 of an induced voltage $u_{ind}$ over a time t.

According to the signal 601, the current $i_A$ ramps up until a time t1, remains constant until a time t2 and decreases again after the time t2 has been reached. During the ramp-up, the induced voltage $u_{ind}$ is at a constant positive level, between the time t1 and the time t2 the signal 602 is (substantially) zero as there is no current change and from the time t2 until the current returns to zero the signal 602 of the induced voltage $u_{ind}$ is at a constant negative level. The MOSFET 103 may thus be switched off when a decreasing current level is detected.

A temperature measurement unit can be connected in parallel to the coil 106 and/or 108 to detect the voltage induced in the respective coil and determine a temperature information based on such voltage. Each coil can be used for temperature measurement purposes by monitoring an alteration of the coil's resistance (which depends on the temperature). Such temperature measurement is preferably conducted when there is no change in the current flowing through the switches 102, 103.

It is also an option to provide a measurement units for one coil or for several coils. It is another option that the measurement unit issues an alarm signal or applies a control signal in case a temperature reaches or exceeds a predefined threshold.

Figure 2:
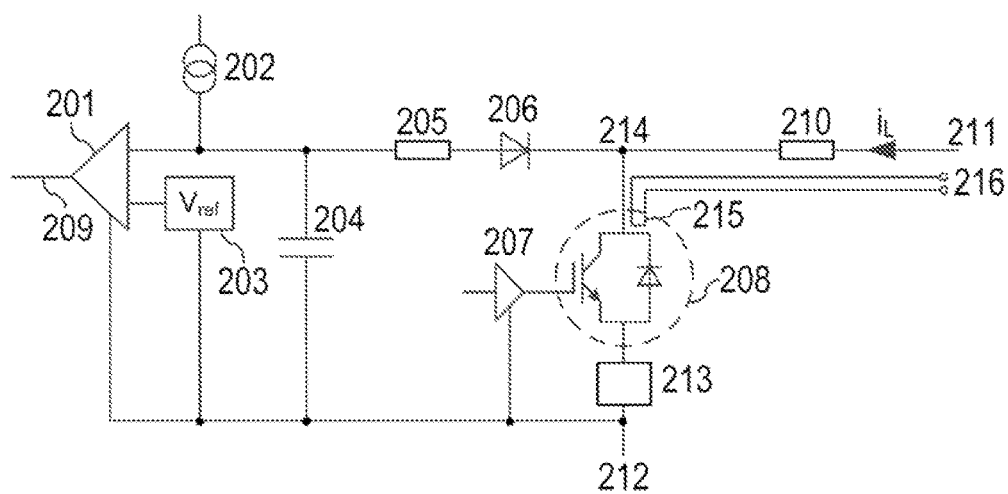
FIG. 2 shows an exemplary circuit for overcurrent detection.

FIG. 2 shows an exemplary circuit for overcurrent detection. A current source 202 supplies a current to a first input of a comparator 201 and via a resistor 205 and a diode 206 to a node 214, wherein the cathode of the diode 206 points towards the node 214. The node 214 is connected via a load 210 to a positive pole 211 of a power supply of the load 210. The collector of a power switch 208 (in particular a transistor, here exemplarily realized as an IGBT) is connected to the node 214.

A reference signal $V_{ref}$ 203 is fed to a second input of the comparator 201. The output of the comparator 209 provides an error signal. The current supplied by the current source 202 is fed via a capacitor 204 to a negative pole 212 of the power supply. Also, the emitter of the power switch 208 is connected via a current sensor 213 to the negative pole 212. The base of the power switch 208 is controlled via a driver 207, which is also supplied by the negative pole 212. The reference signal $V_{ref}$ 203 is provided over the negative pole 212 and the comparator is also connected to the negative pole 212, which can be deemed as ground.

The high voltage diode 206 and the comparator 201 allow monitoring of the collector-emitter-voltage of the power switch 208. In case this collector-emitter-voltage falls outside a measuring range, the power switch 208 is actively switched off via its base and the driver 207.

The power switch 208 comprises a coil 215 that can be connected via two connections 216 to detect or process a voltage induced in the coil 215.

Figure 7:
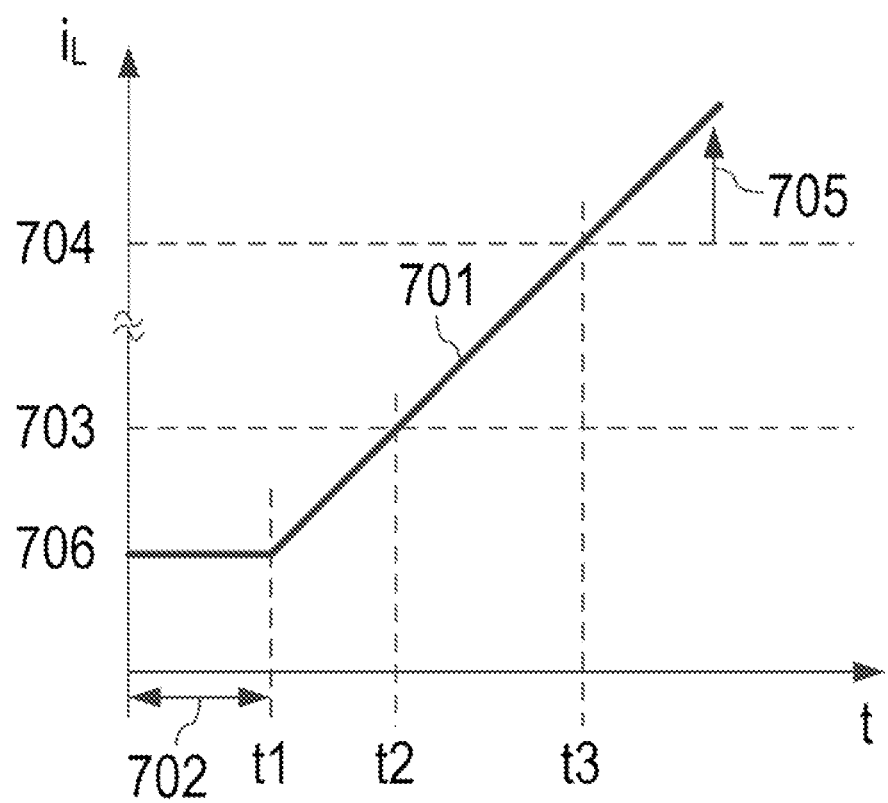
FIG. 7 shows a schematic diagram with a graph of a current through a load over a time t, wherein said current is constantly increasing after a time t1.

FIG. 7 shows a schematic diagram with a graph 701 of a current $i_L$ flowing through the load 210 (see FIG. 2) over a time t. During a time interval 702 of normal operation, the current $i_L$ is on a constant level 706. After a time t1, the current $i_L$ increases and reaches a limit 703 at a time t2. This limit 703 may be the current sensing limit of a common sensor. The current $i_L$, however, increases beyond the limit 703 and may reach a current limit 704 at a time t3 that could result in damaging the power switch 208: if the current $i_L$ is at the level of or larger than the current limit 704, the power switch 208 cannot be opened (i.e. switched off) without damaging or destroying the power switch 208. This is indicated by an arrow 705 visualizing an amount of current $i_L$ that does no longer allow for the power switch 208 to be switched off.

The coil 215 allows detecting a short circuit current and to actively switch off the power switch 208 before the limit 704 is reached. Also, the coil 215 allows detection of the limit 704 and thus it can be avoided to switch off the power switch 208 when this limit 704 is reached or exceeded.

Hence, the solution presented herein in particular suggests providing measurement means on the chip allowing for detecting (in particular measuring) a current change. For example, an increase or a decrease of the current can be determined on the chip. The measurement means may comprise a metallic layer, loop or coil (at least one winding), which may be supplied in a separate manufacturing step or part of a manufacturing step in the manufacturing process of a wafer (integrated circuit). For example, the measurement means can be applied to the chip or module and may be contacted via bonding wires.

It is noted that the expressions loop and coil can be used interchangeably. The coil as well as the loop may have at least one winding. At the end of the loop or coil a voltage can be determined based on electromagnetic induction. It is also an option to provide several coils for detecting the change in the magnetic field, each of said coils having at least one winding.

A voltage is induced if an absolute value of the current change is larger than zero, i.e. abs(di/dt)>0 and at least a part of the resulting magnetic field interacts with the coil.

The measurement means may comprise a measurement loop to detect a change of the magnetic field resulting from the current flowing in the power switch. A voltage is induced into the loop due to the change of the magnetic field and may be detected at the output pins of the loop. The voltage detected can be used for further processing and/or control purposes, in particular to switch off the power switch in case of a current being or becoming too high for the power switch.

Hence, the loop works like a current transformer without a core. The voltage measured may be estimated based on the following exemplary values:

$$di/dt=100\ A/\mu s;\ \mu_r=1;\ L=1\ mm;\ H=2\ mm;\ r=1\ mm,$$

wherein di/dt is a change of current over time, $\mu_r$ is the relative permeability, L is the length of the loop (or coil), H is the height of the loop (or coil) and r is the distance from the wire. The above leads to a measurement area S amounting to $$S=2\cdot10^{-6}\ m^2$$

The voltage in the loop (or coil) thus amounts to $$E = -\frac{dB}{dt} \cdot S$$
$$= \mu_o \mu_r \frac{di}{dt 2\pi r} \cdot S$$
$$= 4 \cdot 10^{-7} \frac{100}{10^{-6}} \cdot \frac{2 \cdot 10^{-6}}{2\pi 10^{-3}} V$$
$$= 40 mV$$

It is an option to arrange more than one loop in or on the chip. In particular, at least two loops may be supplied in or on the chip that allow for generating an inversely phased signal. This enables filtering-out of a common mode interference.

It is also an option to arrange the at least one loop (or coil) as a measurement means in a lower layer of the chip. For example, a planar current portion may be measured pursuant to an orientation of the loop, which may be sufficient for the signal to be determined (the current distributes across the contact surface of the contact between the bonding wire and the chip).

It is another option that the measurement means, e.g., coil, is arranged on one side of the chip with vertical connections that may be realized in trench technology. This allows for a vertical current component to be determined and further processed.

Figure 3:
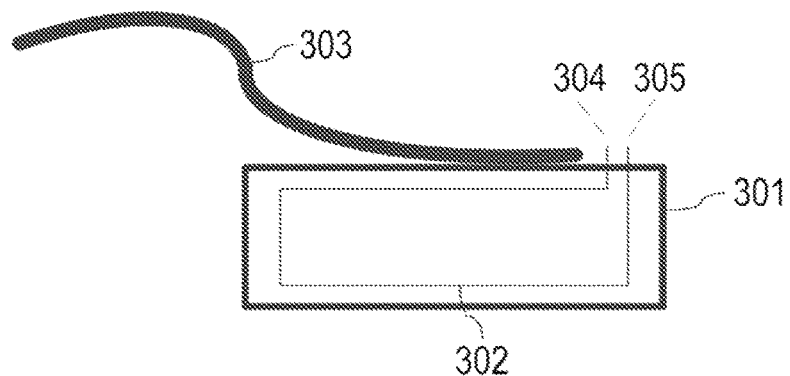
FIG. 3 shows an exemplary diagram of a lateral view of an integrated circuit with a loop arranged on a side of the chip or in parallel to a side of the chip.

FIG. 3 shows an exemplary diagram of a lateral view of an integrated circuit or chip 301 with a loop 302 arranged on a side of the chip 301 or (substantially) in parallel to a side of the chip. The loop 302 can be provided by trench technology. FIG. 3 also shows a bonding wire 303 connected to the chip 301. The loop 302 can be electrically connected using vias. A voltage induced in the loop 302 can be determined at its pins 304 and 305.

Figure 4:
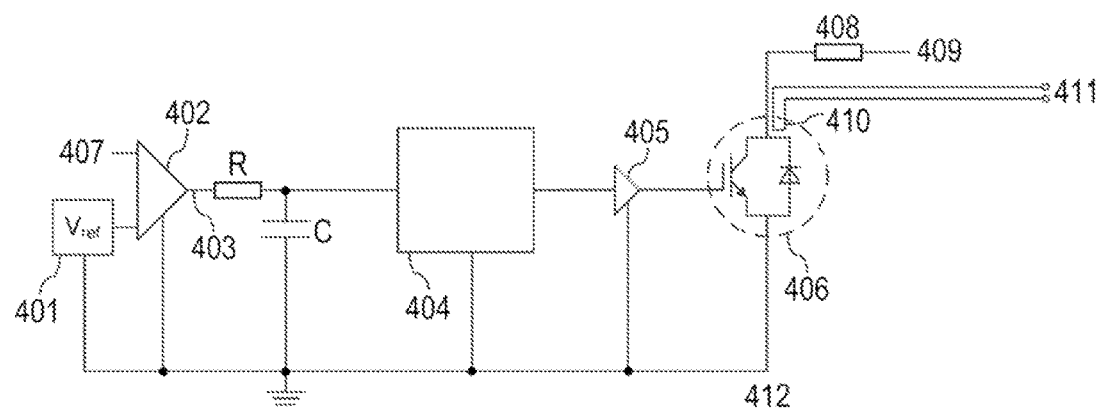
FIG. 4 shows an exemplary circuit diagram for measuring and processing the signals detected by the coils.

FIG. 4 shows an exemplary circuit diagram for measurement purposes. A reference signal $V_{ref}$ 401 is fed to the second input of the comparator 402. The output of the comparator 402 provides a signal 403 (e.g., an error signal) that is fed via a RC element (low pass) to a processing logic 404 and further via a driver 405 to a switching element 406, e.g., a circuit breaker. The switching element 406 can thus be switched off based on the signal 403. The collector of the switching element 406 is connected via a load 408 to a positive pole 409 of a power supply of the load 408 and the emitter of the switching element 406 is connected to a negative pole 412 (or ground) of the power supply of the load 408. Also, the reference signal $V_{ref}$ 401 is supplied over this negative pole 412 (a local ground reference potential, also referred to herein as ground) and the comparator 402, the capacitor C, the processing logic 404 and the driver 405 are connected to the negative pole 412 as reference potential.

The switching element 406 comprises a coil 410 that can be connected via two pins 411 to detect or process a voltage induced in the coil 410. The potential at the pins 411 based on a reference potential can be fed (e.g., via a rectifier) to the first input 407 of the comparator 402.

Processing logic 404 can contain an integrator integrating the measured induced voltage of the coil over a certain time or means to determine a value related to the amplitude of the induced voltage and the time (or duration) it occurs. Hence, the actual level of the overcurrent can be determined (at least to a certain extent). Based thereon, a high-value overcurrent event can be detected, in which the switch has to be maintained in switched on state to avoid damaging it (instead of it being switched off).

Reference is made to FIG. 7 and the explanations above. Hence, it can be determined whether the limit 704 has been reached. If not, it is possible to switch off the switching element 406. If the limit 704 is reached or exceeded (see arrow 705), the switching element 406 must not be switched off. Instead, the switching element 406 has to remain in switched on state until the current $i_L$ through the load falls below said limit 704.

Hence, the solution presented herein in particular provides a measurement means, e.g., a loop-shaped metallic structure (in particular a coil) on the silicon of a chip or on the direct copper bond (DCB), which allows detection of a change in the magnetic field based on a change in the current flowing in (a portion of) the semiconductor device. The change of the current induces a voltage in the loop which can be detected and further processed, e.g., as an error signal.

As an option, the loop (coil) can be used to measure the temperature on the chip based on its resistive characteristics over temperature. This is preferably done when there is no or only limited change of the current (e.g., di/dt=0).

Figure 5:
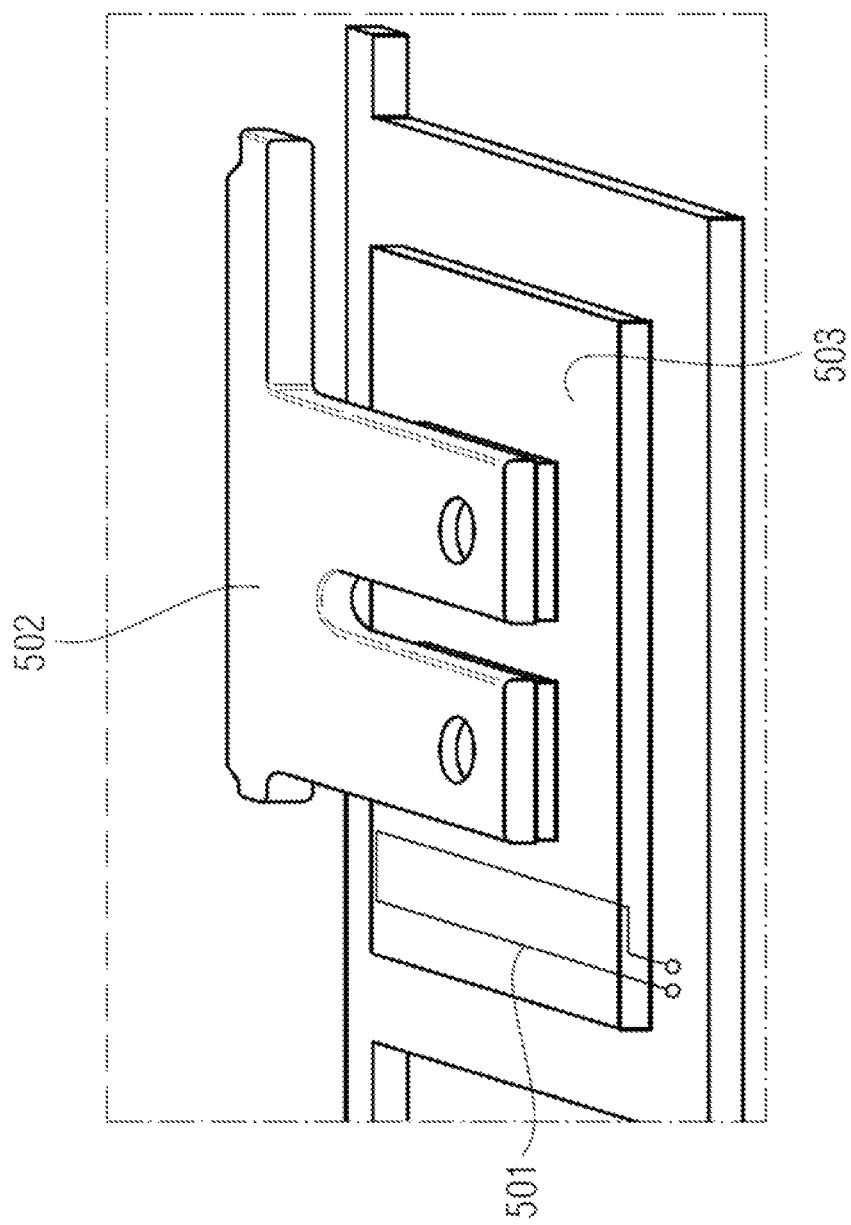
FIG. 5 shows an exemplary implementation with a loop arranged on one side of a bonding of an integrated circuit.

FIG. 5 shows an exemplary implementation. A loop 501 can be arranged on one side of a bonding 502. The loop 501 can be placed on or in(to) an integrated circuit (chip) 503.

The loop 501 can be placed in planar manner (parallel to the chip's surface) on the integrated circuit 503 or inside the integrated circuit 503. It is also an option that several separate loops can be arranged on or in the integrated circuit in at least one layer, in particular on several (parallel) layers in a planar way. The loops can be electrically connected using vias, i.e. perpendicular connections to the surface of the integrated circuit.

It is also an option to amplify the output signal by using several loops or coils.

The signal measured by the (at least one) loop can be led through, e.g., by an auxiliary emitter and an additional pin.

The coil can be realized as a micro coil. The micro coil can be mounted in or on a chip. Details about micro coils can be found at http://www-mat.ee.tu-berlin.de/research/micro-coil/coil.htm.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:
1. An integrated circuit comprising:
    a measurement circuit configured to detect a current change, and
    a control circuit configured to control a switching element,
    wherein said measurement circuit comprises at least one coil located on or in the integrated circuit, wherein the control circuit is configured to determine a current exceeding a predetermined threshold via a voltage induced in the at least one coil over or longer than a predetermined period of time,
wherein the control circuit is configured to maintain the switching element in a switched-on state in case the determined current reaches or exceeds the predetermined threshold, and to switch off the switching element if the determined current does not reach or exceed the predetermined threshold, and
wherein the determined current reaching or exceeding the predetermined threshold corresponds to an overcurrent event in which the switching element is maintained in the switched-on state to not damage the switching element.

2. The integrated circuit according to claim 1, wherein the at least one coil each comprises at least one winding.

3. The integrated circuit according to claim 1, wherein the at least one coil comprises a metallic structure and/or metallic layer that is supplied on the integrated circuit or embedded in the integrated circuit.

4. The integrated circuit according to claim 3, wherein the metallic structure and/or metallic layer is part of a manufacturing step in a manufacturing process of the integrated circuit.

5. The integrated circuit according to claim 1, wherein the at least one coil is arranged substantially in parallel to a surface of the integrated circuit or substantially perpendicular to the surface of the integrated circuit.

6. The integrated circuit according to claim 1, wherein the at least one coil comprises a metallic structure and/or metallic layer that is supplied on several layers of the integrated circuit.

7. The integrated circuit according to claim 1, wherein the at least one coil is used for temperature measurement.

8. The integrated circuit according to claim 1, wherein the coil comprises a micro coil.

9. The integrated circuit according to claim 1, wherein the measurement circuit is contacted by bonding wires.

10. The integrated circuit according to claim 1, wherein said at least one coil is arranged adjacent to an electrical connection.

11. The integrated circuit according to claim 1, wherein said at least one coil is arranged adjacent to a current path of an electronic component.

12. The integrated circuit according to claim 11, wherein the electronic component comprises at least one of a transistor, a FET, a MOSFET or an IGBT.

13. The integrated circuit according to claim 1, wherein the at least one coil is arranged to detect a voltage in the at least one coil due to a magnetic field resulting from a current in the integrated circuit, in particular a change of current in the integrated circuit.

14. The integrated circuit according to claim 13, wherein the voltage detected is used for further processing or control purposes.

15. The integrated circuit according to claim 14, wherein further processing or control comprises switching off a power switch or a circuit breaker.

16. The integrated circuit according to claim 1, wherein the coil is utilized as a current transformer, in particular a current transformer without core.

17. The integrated circuit according to claim 1, wherein the at least one coil comprises at least two loops arranged such that an inversely phased signal is generated.

18. A device for measuring a current change in an integrated circuit, wherein the device is arranged for determining the current change via a voltage that is induced in at least one coil located on or in the integrated circuit,
for determining the current change via the voltage that is induced in the at least one coil for at least a predetermined period of time or longer than the predetermined period of time, and
for maintaining a switching element in a switched-on state in case the determined current change reaches or exceeds a predetermined threshold, and for switching off the switching element if the determined current change does not reach or exceed the predetermined threshold, wherein the determined current reaching or exceeding the predetermined threshold corresponds to an overcurrent event in which the switching element is maintained in the switched-on state to not damage the switching element.

19. The device according to claim 18, wherein said device is part of the integrated circuit.

20. The device according to claim 18, wherein the device is arranged for issuing a signal based on the current change detected, in particular in case the current change reaches or exceeds the predetermined threshold.

21. The device according to claim 20, wherein the signal issued indicates or comprises at least one of the following:
an alarm notification;
an indication that a current has to be limited or reduced, in particular a signal to reduce or limit the current;
an error signal;
a control signal for switching off a component, in particular an electronic switch, transistor, MOSFET, IGBT or FET.

22. The device according to claim 18,
wherein said current change is compared with the predetermined threshold;
wherein a first predefined action is triggered in case a first condition with regard to the predetermined threshold is fulfilled; and/or
wherein a second predefined action is triggered in case the first condition is not fulfilled or in case a different condition is fulfilled.

23. The device according to claim 18, wherein the device is arranged to conduct a temperature measurement based on a change in a resistance of the coil.

24. The device according to claim 23, wherein the device is arranged to conduct the temperature measurement during a phase when the current change is zero or is substantially zero.

25. The device according to claim 18, wherein the coil is utilized as a current transformer, in particular a current transformer without core.

26. A method for measuring a current change in an integrated circuit, comprising:
determining the current change via a voltage that is induced in at least one coil located on or in the integrated circuit, wherein the current change is determined via the voltage that is induced in the at least one coil for at least a predetermined period of time or longer than the predetermined period of time, and
maintaining a switching element in a switched-on state in case the determined current change reaches or exceeds a predetermined threshold, and switching-off the switching element if the determined current change does not reach or exceed the predetermined threshold, wherein the determined current reaching or exceeding the predetermined threshold corresponds to an overcurrent event in which the switching element is maintained in the switched-on state to not damage the switching element.

27. The method according to claim 26, wherein a signal is issued based on the current change detected, in particular in case the current change exceeds the predetermined threshold.

28. The method according to claim 27, wherein the signal issued indicates or comprises at least one of the following:
an alarm notification;
an indication that a current has to be limited or reduced, in particular a signal to reduce or limit the current;
an error signal;
a control signal for switching off a component, in particular an electronic switch, transistor, MOSFET, IGBT or FET.

29. The method according to claim 26, wherein a component is switched off in case the current change determined is below or equals a predefined threshold.

30. The method according to claim 27, wherein a component is not switched off in case the signal indicates that a current limit for the component reaches or exceeds a predefined threshold.

31. The method according to claim 26, wherein a temperature measurement is conducted based on a change in a resistance of the coil.

32. The method according to claim 31, wherein the temperature measurement is conducted during a phase when the current change is zero or is substantially zero.

33. The method according to claim 26, wherein the coil is utilized as a current transformer, in particular a current transformer without core.

34. A device for measuring a current change in an integrated circuit comprising:
a comparing means for comparing a signal from at least one coil that is arranged on or in an integrated circuit with a reference signal, and
a processing logic that is connected to an output of the comparing means, wherein the processing logic provides an output signal dependent on a voltage induced in the at least one coil,
wherein the comparing means and the processing logic are configured to determine a current exceeding a predetermined threshold via the voltage induced in the at least one coil over or longer than a predetermined period of time,
wherein the processing logic is configured to maintain a switching element in a switched-on state in case the determined current reaches or exceeds the predetermined threshold, and to switch-off the switching element if the determined current does not reach or exceed the predetermined threshold, and
wherein the determined current reaching or exceeding the predetermined threshold corresponds to an overcurrent event in which the switching element is maintained in the switched-on state to not damage the switching element.

35. The device according to claim 34, wherein the output signal is connected to a power switch or a circuit breaker.

36. The device according to claim 34, wherein the output signal is connected via a driver to a power switch or a circuit breaker.

37. The device according to claim 34, wherein the output of the comparing means is connected via a low-pass to the processing logic.

38. The device according to claim 34, wherein the at least one coil is a micro coil.

39. The device according to claim 34, wherein the comparing means is a comparator.

40. A system for measuring a current change in an integrated circuit comprising:
means for determining the current change via a voltage that is induced in at least one coil for at least a predetermined period of time or longer than the predetermined period of time, wherein the at least one coil is located on or in the integrated circuit, and
means for maintaining a switching element in a switched-on state in case the determined current change reaches or exceeds a predetermined threshold, and switching-off the switching element if the determined current change does not reach or exceed the predetermined threshold, wherein the determined current reaching or exceeding the predetermined threshold corresponds to an overcurrent event in which the switching element is maintained in the switched-on state to not damage the switching element.

41. The system according to claim 40, wherein the integrated circuit is part of the system.

42. The system according to claim 40, comprising means for issuing a signal based on the current change detected, in particular in case the current change reaches or exceeds a predetermined threshold.

43. The system according to claim 40,
comprising means for comparing the current change with a predetermined threshold;
comprising means for triggering a first predefined action in case a first condition with regard to the predetermined threshold is fulfilled; and/or
comprising means for triggering a second predefined action in case the first condition is not fulfilled or in case a different condition is fulfilled.

44. The system according to claim 40, comprising means for conducting a temperature measurement based on a change a resistance of the coil.

45. The system according to claim 40, comprising means for conducting a temperature measurement during a phase when the current change is zero or is substantially zero.

* * * * *